(12) United States Patent
Lu et al.

(10) Patent No.: US 7,055,102 B2
(45) Date of Patent: May 30, 2006

(54) TURBO DECODER USING PARALLEL PROCESSING

(75) Inventors: Jin Lu, Croton On Hudson, NY (US); Joon-Hwa Chun, Lake Grove, NY (US); Erdem Hokenek, Yorktown Heights, NY (US); Mayan Moudgill, White Plains, NY (US)

(73) Assignee: Sandbridge Technologies, Inc., White Plains, NY (US)

( * ) Notice: Subject to any disclaimer, the term of this patent is extended or adjusted under 35 U.S.C. 154(b) by 452 days.

(21) Appl. No.: 10/310,919

(22) Filed: Dec. 6, 2002

(65) Prior Publication Data

US 2004/0111659 A1    Jun. 10, 2004

(51) Int. Cl.
*H03M 13/45* (2006.01)

(52) U.S. Cl. .................... 715/755; 714/780; 714/792

(58) Field of Classification Search ............... 714/755, 714/780, 792, 794
See application file for complete search history.

(56) References Cited

U.S. PATENT DOCUMENTS

| | | | |
|---|---|---|---|
| 6,145,114 A | | 11/2000 | Crozier et al. |
| 6,292,918 B1 | | 9/2001 | Sindhushayana et al. |
| 6,304,995 B1 | | 10/2001 | Smith et al. |
| 6,343,368 B1 | * | 1/2002 | Lerzer .................. 714/796 |
| 6,377,610 B1 | | 4/2002 | Hagenauer et al. |
| 6,484,283 B1 | * | 11/2002 | Stephen et al. ............ 714/786 |
| 6,563,877 B1 | * | 5/2003 | Abbaszadeh ............... 375/242 |
| 6,715,120 B1 | * | 3/2004 | Hladik et al. ............... 714/755 |
| 6,754,290 B1 | * | 6/2004 | Halter ...................... 375/340 |
| 6,760,879 B1 | * | 7/2004 | Giese et al. ................ 714/755 |
| 6,813,743 B1 | * | 11/2004 | Eidson ..................... 714/795 |
| 6,829,313 B1 | * | 12/2004 | Xu .......................... 375/341 |
| 6,856,657 B1 | * | 2/2005 | Classon et al. ............. 375/341 |
| 6,865,711 B1 | * | 3/2005 | Arad et al. ................. 714/796 |
| 2001/0046269 A1 | | 11/2001 | Gatherer et al. |
| 2002/0118776 A1 | | 8/2002 | Blankenship et al. |

FOREIGN PATENT DOCUMENTS

WO    WO 00/59118    10/2000

OTHER PUBLICATIONS

Yoon, S. et al.: "A parallel MAP algorithm for low latency turbo decoding," IEEE Communications Letters, vol. 6, No. 7, pp. 288-290 (Jul. 2002).

Youyun, X. et al.: "VLSI design and implementation of WCDMA channel decoder," Proc. of Canadian Conference on Electrical and Computer Engineering 2001, Toronto, Canada, vol. 1, pp. 241-245 (May 2001).

(Continued)

*Primary Examiner*—Stephen M. Baker
(74) *Attorney, Agent, or Firm*—Barnes & Thornburg LLP (57) ABSTRACT

A method of decoding using a log posterior probability ratio $L(u_k)$, which is a function of forward variable $\alpha$ (.) and backward variable $\beta$ (.). The method comprises dividing the forward variable $\alpha$ (.) and the backward variable $\beta$ (.) into, for example, two segments p and q, where p plus q equal the length of the code word U. The forward segments $\alpha$ (.) are parallel calculated, and the backward segments $\beta$ (.) are parallel calculated. The ratio $L(u_k)$ is calculated using the parallel calculated segments of $\alpha$ (.) and $\beta$ (.).

18 Claims, 5 Drawing Sheets

OTHER PUBLICATIONS

Akella, R. et al.: "On the parallel MAP algorithm," Proc. of 2001 IEEE 4th Workshop on Multimedia Signal Processing, Cannes, France, pp. 371-376 (Oct. 2001).

Worm, A. et al.: "VLSI architectures for high-speed MAP decoders," Proc. of 14th Int'l Conference on VLSI Design, Bangalore, India, pp. 446-453 (Jan. 2001).

Hunt, A. et al.: "Performance degradation as a function of overlap depth when using sub-block processing in the decoding of turbo codes," Proc. of 6th Int'l Mobile Satellite Conference 1999, Ottawa, Canada, pp. 276-280 (Jun. 1999).

Hsu, J. et al.: "A parallel decoding scheme for turbo codes," Proc. of the 1998 IEEE Int'l Symposium on Circuits and Systems, vol. 1, pp. 445-448 (May 1998).

S. Pietrobon, "Implementation and Performance of a Turbo/MAP Decoder".

M.C. Valenti and J. Sun, "The UMTS Turbo Code and an Efficient Decoder Implementation Suitable for Software-Defined Radios," *International Journal of Wireless Information Networks*, vol. 8, No. 4, Oct. 2001 (© 2002).

* cited by examiner

TURBO DECODER USING PARALLEL PROCESSING

BACKGROUND AND SUMMARY OF THE INVENTION

The present invention relates generally to decoders and, more specifically, to a turbo decoder that reduces processing time for the computation of A Posteroiri Probability (APP) and is suitable for implementation in parallel processing architectures.

Data delivered over a telecommunication channel are subject to channel noise, channel fading, and interferences from other channels. As a result, data received at the destination are usually "altered" by the channel from those delivered at the source. To ensure error-free transmission, the data are encoded before transmission by a channel encoder to allow the data receiver to detect or correct the errors. For example, if bit 0 is encoded as 000 and bit 1 is encoded as 111, then when one bit error occurs, 000 may become 100, and 111 may becomes 101. The receiver can correct 100 as 000 (bit 0) and 101 as 111 (bit 1) by the "majority rule" or the hamming distance. The part of receiver responsible for correcting errors is called a channel decoder.

Turbo encoders and decoders are used in emerging high-speed telecommunications transmission systems, such as terrestrial digital TV communication systems, and third generation wireless (e.g., WCDMA) communication systems. A turbo decoder has been demonstrated to approach the error correcting limit on both AWGN and Rayleigh fading channels.

Despite the error-correcting efficiency, however, a turbo decoder is computing intensive. To meet the real-time performance (e.g., a few millisecond), it is usually implemented in ASIC. If a turbo decoder is to be implemented in software running on a DSP or a CPU, as in the context of software defined radio, its real-time performance will be improved.

Figure 1:
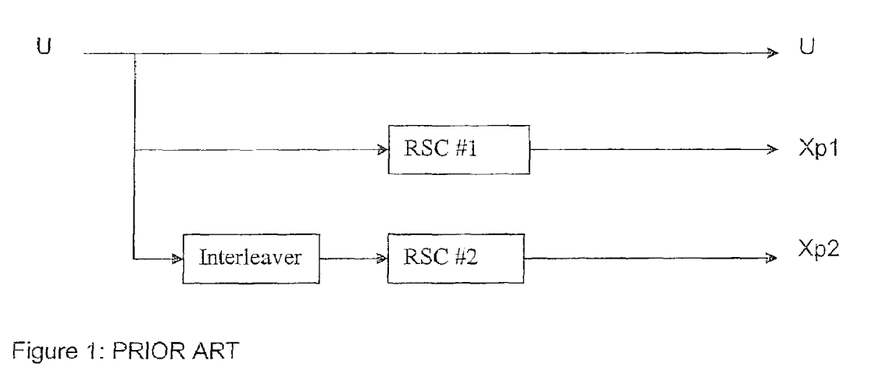
FIG. 1 is a block diagram of a 3GPP turbo decoder of the prior art.

A 3GPP turbo encoder (FIG. 1) consists of a parallel concatenation of two identical RSC (Recursive Systematic Convolutional) encoders separated by an interleaver. The info word U of length K is encoded by the first RSC encoder, and the interleaved info word is encoded by the second RSC encoder. The interleaver de-correlates the inputs to the two RSC's by reordering the input bits to the second RSC, so that it is unlikely that the encoded bits from both RSC's have low weight code words at the same time. Also, it helps the encoded bits to cope with bursty noise. In 3GPP turbo encoder, a pseudo-random block interleaver is used. Both RSC encoded words are terminated by a trellis termination. The turbo encoded words are consists of systematic bits and two parity bits (U, Xp1, Xp2).

Figure 2:
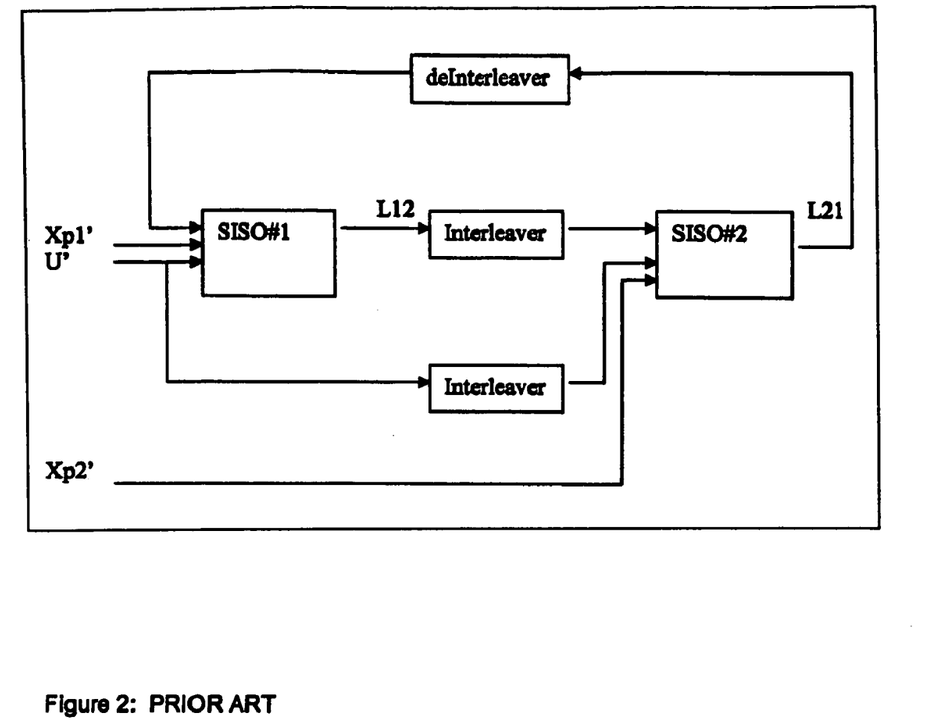
FIG. 2 is a block diagram of a 3GPP turbo decoder of the prior art.

As shown in FIG. 2, the standard turbo decoder consists of two concatenated SISO (Soft Input Soft Output) blocks, one for each set of systematic and parity bits, (U',Xp1') and (U',Xp2'), where Xp1' and Xp2' denote the noisy version of Xp1 and Xp2, respectively, and the same for U' (U refers to the info words). The SISO blocks are A Posteriori Probability (APP) decoders also know as Maximum A Posteriori (MAP) decoders. The two SISO blocks are separated by the same interleaver (as the encoder) and its inverse block, the deinterleaver. Upon reception of bits from channel and priori information, each SISO block computes log posterior ratios of each bit with well-known forward and backward algorithm. Once SISO computes the log posterior ratios of all bits, it separates a probabilistic entity that was calculated based on its input from overall posterior, then pass it to the other SISO block. This probabilistic entity is often called extrinsic information (L12 and L21 in FIG. 2) for the other SISO block to use as prior information. The two SISO blocks run in an iterative scheme, mutually exchanging extrinsic information. After the required number of iterations is completed, hard decision is made based on accumulated soft information up to the iteration.

The log posterior probability ratio can be written as:

$$L(u_k) = \log\left(\frac{P(u_k = +1 \mid y)}{P(u_k = -1 \mid y)}\right) = \log\left(\frac{\sum_{S^+} P(S_{k-1}, S_k, y)/P(y)}{\sum_{S^-} P(S_{k-1}, S_k, y)/P(y)}\right), \quad (1)$$

where $S^+$ and $S^-$ denote the set of all possible state transitions caused by data input $u_k=+1$ and $u_k=-1$, respectively, and y denotes the set of observations, $y=(y_1, \ldots, y_k)$ where $y_k=(u_k', x_k')$, $k=1, \ldots, K$. Note that $y \in (U', Xp1', Xp2')$.

As usual, the posterior probability can be obtained by way of computing weighted likelihood, where weights are provided by the prior probability of the event $u_k$. Direct evaluation of weighted likelihood requires the summations over a very large number of state patterns, which is proportional to the sequence length K. Because of the combinatorial complexity, it is not computationally feasible even for a reasonable length of the sequence.

To reduce the computation, an efficient procedure, known as forward and backward algorithm, is often used. In this algorithm, the posterior probability $P(u_k|y)$ is factorized into following 3 terms:

Forward variable, $\alpha_k(.)$,

Backward variable, $\beta_k(.)$,

State transition probability, $\gamma_k(.,.)$.

The $\alpha_k(.)$ is the joint probability of the observations $y_1, \ldots, y_k$ and the state at time k, that is $\alpha_k(S)=P(S_k, y_1, \ldots, y_k)$. The $\beta_k(.)$ represents the conditional probability of future observations given state at time k, $\beta_k(S)=P(y_1, \ldots, y_{K+1}|S_k)$. The $\gamma_k(.,.)$ is the probability of the state transitions from k−1 to k, caused by $u_k$, and expressed as $\gamma_k(S', S)=P(S_k=S, y_k|S_{k-1}=S')$.

The procedure of recursive calculation of $\alpha_k(S)$ is implemented according to $$\alpha_k(S) = \sum_{S^*} \alpha_{k-1}(s')\gamma_k(S', S).$$

For $\beta_k(S)$, the calculation is proceeded recursively as:

$$\beta_k(S) = \sum_{S^*} \beta_{k+1}(S')\gamma_{k+1}(S, S').$$

Since the turbo encoder is expected to start and end in state 1, the initial conditions for $\alpha_k(.)$ and $\beta_k(.)$ are known and given as $\alpha_0(S)=\delta_{\{S,1\}}$ and $\beta_K(S)=\delta_{\{S,1\}}$, respectively, where $\delta_{\{.,.\}}$ denote the Kronecker delta.

Calculation of the posterior entity $L(u_k)$ as a function $f(\alpha_k(.), \beta_k(.))$ is then equivalent to:

$$P(u_k | y) = \frac{\sum_{S^*} \alpha_{k-1}(s')\gamma_k(S', S)\beta_k(S)}{P(y)} \quad (2)$$

where S* is the set of state pairs corresponding to all state transitions caused by $u_k=+1/-1$, and P(y) is a normalization constant.

The procedure of forward and backward algorithm is summarized as:

Calculate $\gamma_k(.,.)$, k=1,2, ..., K;
Calculate $\alpha_k(.,.)$ forward recursively, k=1,2, ..., K;
Calculate $\beta_k(.,.)$ backward recursively, k=K-1, ... 0;
Calculate (2) to form (1).

The present invention is a method of decoding using a log posterior probability ratio $L(u_k)$, which is a function of forward variable $\alpha$ (.) and backward variable $\beta$ (.). The method comprises dividing the forward variable $\alpha$ (.) and the backward variable $\beta$ (.) into, for example, two segments p and q, where p plus q equal the length of the codeword U. The forward segments $\alpha$ (.) are parallel calculated, and the backward segments $\beta$ (.) are parallel calculated. The ratio $L(u_k)$ is calculated using the parallel calculated segments of $\alpha$ (.) and $\beta$ (.). The first forward segment is calculated from $\alpha_1(.), \ldots, \alpha_p(.)$ starting from $\alpha_0(.)$, whereas the second forward segment is calculated from $\alpha_{p+1}(.), \ldots, \alpha_K(.)$ starting from an estimated $\alpha_p(.)$. The first backward segment is calculated from $\beta_{K-1}(.), \ldots, \beta_{q+1}(.)$ starting from $\beta_K(.)$, and the second backward segment is calculated from $\beta_q(.), \ldots, \beta_1(.)$ starting from an estimated $\beta_{q+1}(.)$.

To obtain the estimated initial point $\alpha$ (.), the forward variable is calculated recursively from p-d+1 where d is an arbitrary amount of time and the state at time p-d+1 is treated as a uniform random variable. Similarly, for $\beta_{q+1}(.)$, the backward variable is calculated from q+d and again the state at time q+d is treated as a uniform random variable. With treating the states at time p-d+1 and q+d as uniform random variables, no informative prior knowledge of the states at the time is claimed.

The arbitrary amount of time, d, is in the range of 1 to 20 or may be in the range of 15 to 20. Also, the starting points for the estimated probability may also be a predetermined state. This predetermined state may be one divided by the number of possible states.

The method may include dividing the forward variable $\alpha$ (.) and the backward variable $\beta$ (.) into more than two segments, and each of the forward and reverse segments would be calculated in parallel.

The process is performed in a signal receiver including a decoder.

These and other aspects of the present invention will become apparent from the following detailed description of the invention, when considered in conjunction with accompanying drawings.

DETAILED DESCRIPTION OF THE PREFERRED EMBODIMENTS

One problem with the standard turbo decoding algorithm is that if the size of input sequence K is large, the time required for the computation of the above forward and backward variables grows, causing a long latency as we go through the forward and backward algorithms. K may reach 5114 bits. To reduce the time in calculating $\alpha_k(.)$ and $\beta_k(.)$, the input data is divided into M segments and simultaneously calculate the $\alpha_k(.)$ and $\beta_k(.)$ for the M segments. Truncation loss may occur with this segment-based approach; however, simulation results show that the loss was negligible when M=2.

In theory, this parallel scheme reduced the computation to nearly 1 out of M of the original calculation of $\alpha_k(.)$ and $\beta_k(.)$ (e.g. ½ for M=2). The parallel computing is for the calculation of $\alpha_k(.)$ and $\beta_k(.)$, which are the most computational intensive part of a turbo decoder.

The parallel algorithm will be discussed for the case of M=2 as an example. For M>2, the algorithm is similar. The algorithm consists of the following steps:

1. Divide the forward and the backward variable into two parallel segments of size p and q, respectively, where p+q=K.

Figure 5:
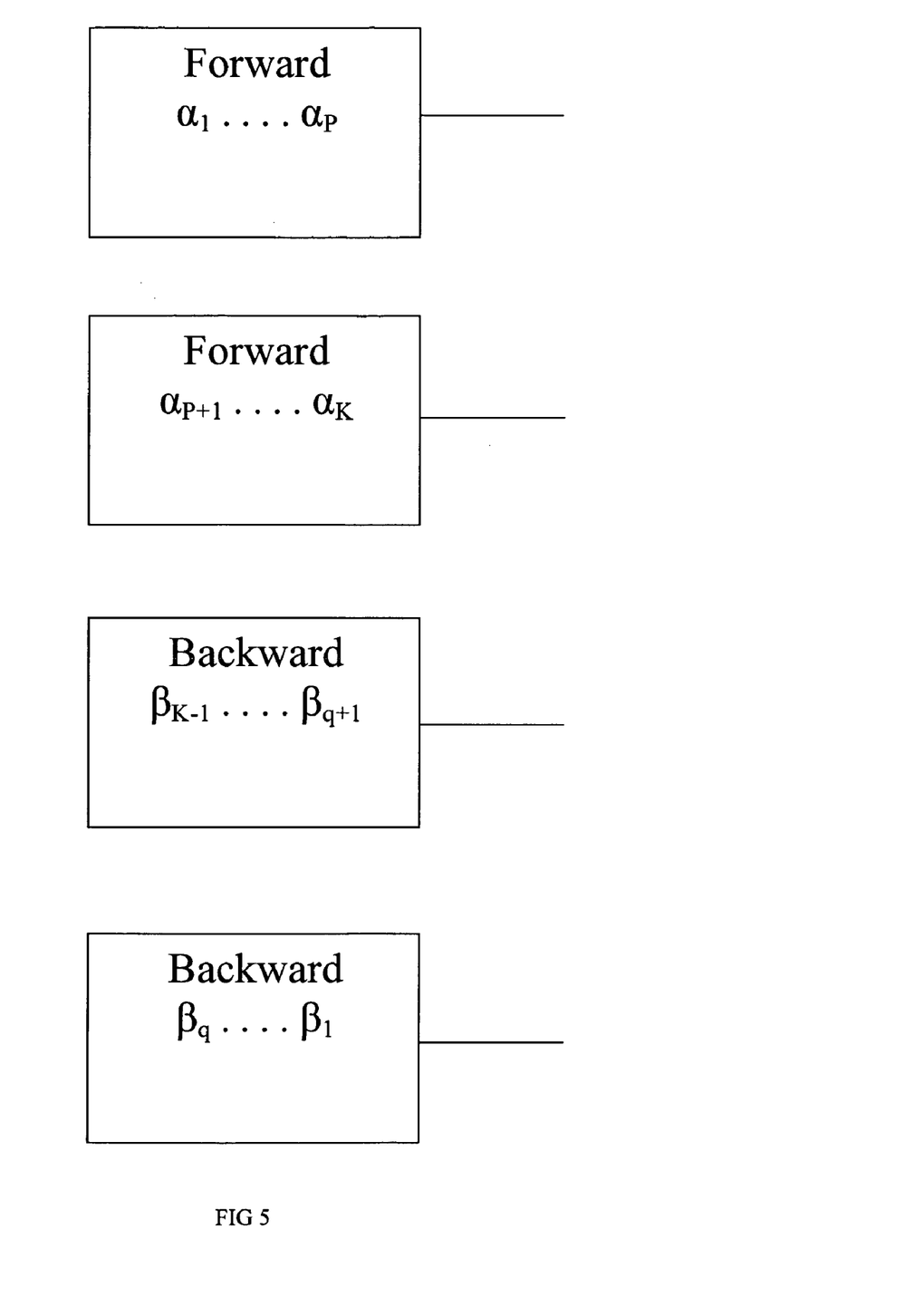
FIG. 5 is a blocked diagram of a Soft Input Soft Output block according to the present disclosure.

2. Calculate the four segments simultaneously with the following four processes as shown in FIG. 5:

Process 1: calculate $\alpha_1(.), \ldots, \alpha_p(.)$ starting from $\alpha_0(.)$;
Process 2: calculate $\alpha_{p+1}(.), \ldots, \alpha_K(.)$ starting from an estimated $\alpha_p(.)$, say $\alpha_p'(.)$;
Process 3: calculate (backwardly) $\beta_{K-1}(.), \ldots, \beta_{q+1}(.)$ starting from $\beta_K(.)$; and
Process 4: calculate (backwardly) $\beta_q(.), \ldots, \beta_1(.)$ starting from an estimated $\beta_{q+1}(.)$, say $\beta_{q+1}'(.)$.

Process 1 and 3 are run as regular turbo alpha and beta calculation with known initial points (with reduced size), process 2 and 4 require estimated initial points.

$\beta_{q+1}'(.)$ for process 4. The first iteration starts from $\alpha_{p-d+1}(.)$ where d is an arbitrary amount of time steps. The state at time p-d+1 is treated as a uniform random variable. This implies that the probability of a specific state occurs at p-d+1 is ⅛ since the 3GPP turbo encoder has 8 system states. As a consequence, $\alpha_{p-d+1}(.)=$⅛ and similarly so does $\beta_{q+d}(.)$. Starting from this uniform prior, when the process reaches at p, the estimate $\alpha_p'(.)$ results, and at q+1, the estimate $\beta_{q+1}'(.)$ results.

The amount of information extracted from the observation for the duration d is proportional to d. A longer d may give a better initial estimate. However, since the computation during d steps represents "overhead", d should not be increased more than a certain limit. While d may be in the range of 1~20, simulation show that d=15~20 provides decent results. From the second iteration on, $\alpha_{p-d+1}(.)$ and $\beta_{q+d}(.)$ can be chosen by the same way as for the first iteration, or the values resulted from process 1 and process 3 in previous iteration can be used.

Simulation scenarios are defined by SNR (signal to noise ratio). For each scenario, 2000 packets of size 5114 bits were randomly generated, turbo encoded, and subjected to AWGN noise. The "spoiled" packets were run through both the regular prior art and present parallel turbo decoders. For the parallel turbo decoders of the present invention, the number of divisions M=2 and the length for initial estimation d=20 in the parallel algorithm, and the appropriate values of the previous iterations as the starting points of the initial estimation of the current iteration were used.

Figure 3:
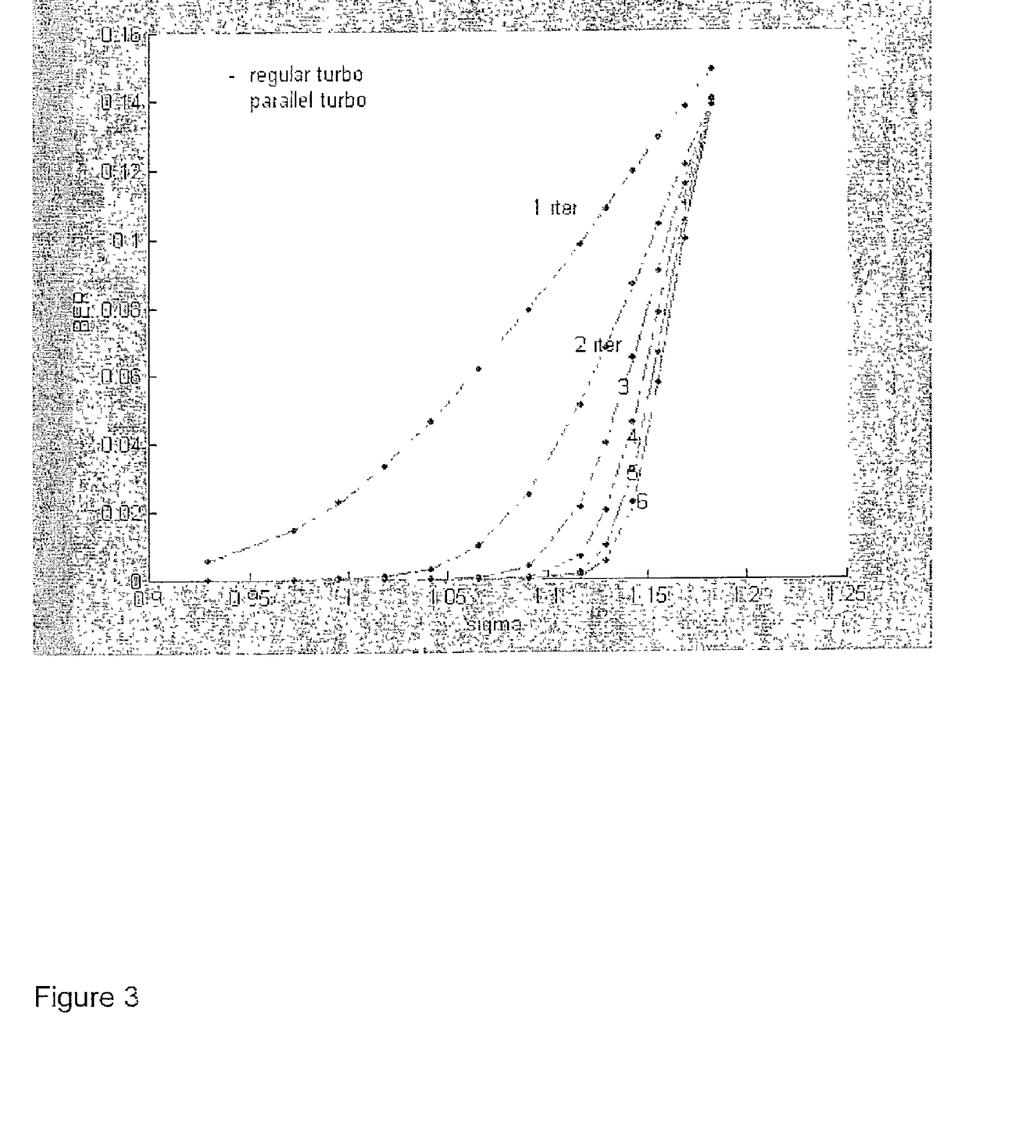
FIG. 3 is a graph of bit error rate (BER) for a turbo decoder of the prior art and for a turbo decoder of the present invention under various signal to noise ratios (SNRs).
Figure 4:
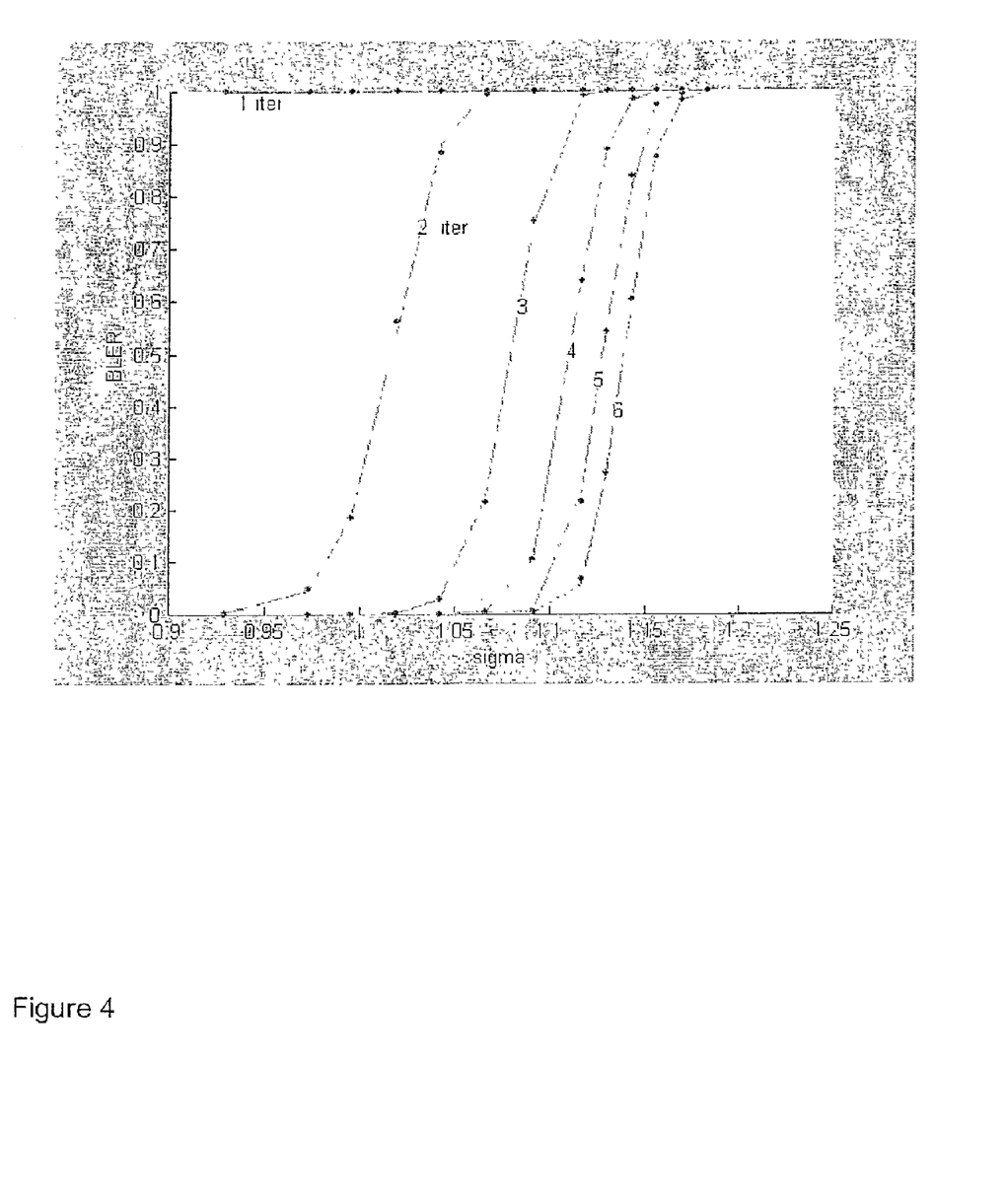
FIG. 4 is a graph of block error rate or packet error rate (BLER) of the prior art turbo decoder and a turbo decoder according to the present invention under various SNR.

FIG. 3 and FIG. 4 compare the BER (bit error rate) and BLER (block error rate, or packet error rate) of the regular turbo decoder and parallel turbo decoder under various SNR. The results were so close they are not dissemble on the graphs.

Although the number of segments M=2 has been used as an example, a larger number for M may be used. In such case, the equations would have the general formula as follows: $L(u_k)=f(\alpha_k(.), \beta_k(.))$. The definitions of the estimated starting points would be $\alpha_p(.), \ldots, \alpha_w(.)$ and $\beta_w(.), \ldots, \beta_{q+1}(.)$. The forward variable segments are calculated as follows:

$$\alpha_1(.), \ldots, \alpha_p(.) \text{ starting from } \alpha_0(.)$$
$$\alpha_{p+1}(.), \ldots, \alpha_q(.) \text{ starting from } \alpha_p(.)$$
$$\vdots$$
$$\alpha_{w+1}(.), \ldots, \alpha_K(.) \text{ starting from } \alpha_w(.)$$

and the reverse variable segments are calculated as follows:

$$\beta_{K-1}(.), \ldots, \beta_{w+1}(.) \text{ starting from } \beta_K(.)$$
$$\beta_w(.), \ldots, \beta_{v+1}(.) \text{ starting from } \beta_{w+1}(.)$$
$$\vdots$$
$$\beta_q(.), \ldots, \beta_1(.) \text{ starting from } \beta_{q+1}(.).$$

The starting points for the forward variable are estimated from:

$$\alpha_{p-d+1}(.), \ldots, \alpha_p(.) \text{ and}$$
$$\vdots$$
$$\alpha_{w-d+1}(.), \ldots, \alpha_w(.); \text{ and}$$

for the backward segments from:
$\beta_{w+d}(.), \ldots, \beta_{w+1}(.)$ and
$\beta_{q+d}(.), \ldots, \beta_{q+1}(.)$ where d is an arbitrary amount of time steps.

It should also be noted that even though turbo decoders are discussed, any system that uses the A Posteriori Probability decoding may use the present invention.

Although the present invention has been described and illustrated in detail, it is to be clearly understood that this is done by way of illustration and example only and is not to be taken by way of limitation. The spirit and scope of the present invention are to be limited only by the terms of the appended claims.

What is claimed is:

1. A method of a turbo decoder using log A Posteriori Probability $L(u_k)$, where $L(u_k)=f(\alpha_k(.), \beta_k(.))$, the method comprising:

dividing a forward variable $\alpha(.)$ and a backward variable $\beta(.)$ into a plurality M of parallel segments of size p, q ... w, where p+q, ... +w equals the length of a coded word U;

simultaneous, parallel calculating the segments of forward variable $\alpha(.)$ of the code word U as follows:

$$\alpha_1(.), \ldots, \alpha_p(.) \text{ starting from } \alpha_0(.)$$
$$\alpha_{p+1}(.), \ldots, \alpha_q(.) \text{ starting from } \alpha_p(.)$$
$$\vdots$$
$$\alpha_{w+1}(.), \ldots, \alpha_K(.) \text{ starting from } \alpha_w(.);$$

and the segments of the backward variable $\beta(.)$ of the code word U as follows:

$$\beta_{K-1}(.), \ldots, \beta_{w+1}(.) \text{ starting from } \beta_K(.)$$
$$\beta_w(.), \ldots, \beta_{v+1}(.) \text{ starting from } \beta_{w+1}(.)$$
$$\vdots$$
$$\beta_q(.), \ldots, \beta_1(.) \text{ starting from } \beta_{q+1}(.);$$

and calculating $L(u_k)$ using the parallel calculated segments of $\alpha(.)$ and $\beta(.)$.

2. The method according to claim 1, wherein the segment sizes are set equal.

3. A signal receiver including a decoder performing the method according to claim 1.

4. The method according to claim 1, wherein the starting points $\alpha_p(.), \ldots, \alpha_w(.)$ are estimated, and the starting points $\beta_{w+1}(.), \ldots, \beta_{q+1}$ are estimated.

5. The method according to claim 4, wherein the starting points for the forward variable are estimated from:

$$\alpha_{p-d+1}(.), \ldots, \alpha_p(.)$$
$$\vdots$$
$$\alpha_{w-d+1}(.), \ldots, \alpha_w(.);$$

and
for the backward segments from:

$$\beta_{w+d}(.), \ldots, \beta_{w+1}(.)$$
$$\vdots$$
$$\beta_{q+d}(.), \ldots, \beta_{q+1}(.)$$

where d is an arbitrary amount of time steps.

6. The method according to claim 5, wherein d is in the range of 1 to 20.

7. The method according to claim 5, wherein d is in the range of 15 to 20.

8. The method according to claim 5, wherein the probabilities of the first states for estimating the starting points are uniform random variables.

9. The method according to claim 5, wherein the first states for estimating the starting points are a predetermined state.

10. The method according to claim 5, wherein the first states for estimating the starting point is one divided by the number of possible states.

11. A method of decoding using a log A Posteriori Probability ratio $L(u_k)$ where $L(u_k)=f(\alpha_k(.), \beta_k(.))$, the method comprising:

dividing a forward variable $\alpha(.)$ and a backward variable $\beta(.)$ into two segments p and q where p+q equals the length of the code word U;

parallel calculating the forward segments:
$\alpha_1(.), \ldots, \alpha_p(.)$ starting from a known $\alpha_0(.)$ and
$\alpha_{p+1}(.), \ldots, \alpha_k(.)$ starting from an estimated $\alpha_p(.)$;

parallel calculating the backward segments:
$\beta_{K-1}(.), \ldots, \beta_{q+1}(.)$ starting from a known $\beta_K(.)$ and
$\beta_q(.), \ldots, \beta_1(.)$ starting from an estimated $\beta_{q+1}(.)$; and
calculating $L(u_k)$ using the parallel calculated segments of $\alpha(.)$ and $\beta(.)$.

wherein the forward and backward segments are calculated simultaneously.

12. A signal receiver including a decoder performing the method according to claim 11.

13. A method according to claim 11, wherein the estimated starting point $\alpha_p(.)$ is estimated from state probabilities $\alpha_{p-d+1}(.), \ldots, \alpha_p(.)$, and the estimated starting point $\beta_{q+1}(.)$ is estimated from state probabilities for $\beta_{q+d}(.), \ldots, \beta_{q+1}(.)$.

14. A method according to claim 13, wherein d is in the range of 1 to 20.

15. A method according to claim 13, wherein d is in the range of 15 to 20.

16. A method according to claim 13, wherein the probabilities of the first states for estimating the starting points are uniform random variables.

17. A method according to claim 13, wherein the first states for estimating the starting points are a predetermined state.

18. A method according to claim 13, wherein the first states for estimating the starting point is one divided by the number of possible states.

* * * * *